US010921394B2

(12) United States Patent
Roy-Guay

(10) Patent No.: US 10,921,394 B2
(45) Date of Patent: Feb. 16, 2021

(54) VECTORIAL MAGNETOMETER AND ASSOCIATED METHODS FOR SENSING AN AMPLITUDE AND ORIENTATION OF A MAGNETIC FIELD

(71) Applicant: SOCPRA SCIENCES ET GENIE S.E.C., Sherbrooke (CA)

(72) Inventor: David Roy-Guay, Sherbrooke (CA)

(73) Assignee: SOCPRA SCIENCES ET GENIE S.E.C., Sherbrooke (CA)

( * ) Notice: Subject to any disclaimer, the term of this patent is extended or adjusted under 35 U.S.C. 154(b) by 317 days.

(21) Appl. No.: 16/089,043

(22) PCT Filed: Apr. 7, 2017

(86) PCT No.: PCT/CA2017/050424
§ 371 (c)(1),
(2) Date: Sep. 27, 2018

(87) PCT Pub. No.: WO2017/173548
PCT Pub. Date: Oct. 12, 2017

(65) Prior Publication Data
US 2020/0300945 A1 Sep. 24, 2020

Related U.S. Application Data

(60) Provisional application No. 62/319,935, filed on Apr. 8, 2016.

(51) Int. Cl.
*G01R 33/24* (2006.01)
(52) U.S. Cl.
CPC .................................. *G01R 33/24* (2013.01)

(58) Field of Classification Search
None
See application file for complete search history.

(56) References Cited

U.S. PATENT DOCUMENTS

| 8,547,090 | B2 | 10/2013 | Lukin et al. |
| 8,947,080 | B2 | 2/2015 | Lukin et al. |
| 9,541,610 | B2 | 1/2017 | Kaup et al. |
| 9,551,763 | B1 | 1/2017 | Hahn et al. |
| 9,638,821 | B2* | 5/2017 | Meyer .................... G01V 3/081 |
| 9,910,105 | B2* | 3/2018 | Boesch ................ G05D 1/0088 |

(Continued)

FOREIGN PATENT DOCUMENTS

| WO | 2009073736 A1 | 6/2009 |
| WO | 2014165505 A1 | 10/2014 |
| WO | 2017173548 A1 | 10/2017 |

OTHER PUBLICATIONS

Vector magnetic field microscopy using nitrogen vacancy centers in diamond, B. J. Maertz, A. P. Wijnheijmer, G. D. Fuchs, M. E. Nowakowski, and D. D. Awschalom; (accepted Feb. 8, 2010; published online Mar. 1, 2010).

(Continued)

*Primary Examiner* — Jermele M Hollington
(74) *Attorney, Agent, or Firm* — Norton Rose Fulbright Canada LLP; Alexandre Daoust

(57) ABSTRACT

The vectorial magnetometer association of the detected spin-state-altering energy level and the corresponding defect orientations can be performed by generating Rabi flopping at each one of the energy levels and performing the association based on the detected Rabi flopping.

15 Claims, 12 Drawing Sheets

(56) References Cited

U.S. PATENT DOCUMENTS

| | | | |
|---|---|---|---|
| 2010/0308813 | A1 | 12/2010 | Lukin et al. |
| 2010/0315079 | A1 | 12/2010 | Lukin et al. |
| 2011/0062957 | A1 | 3/2011 | Fu et al. |
| 2015/0001422 | A1 | 1/2015 | Englund et al. |
| 2015/0090033 | A1 | 4/2015 | Budker et al. |
| 2015/0253355 | A1* | 9/2015 | Grinolds ............... G01R 33/60 850/40 |
| 2016/0216340 | A1 | 7/2016 | Egan et al. |
| 2017/0343695 | A1* | 11/2017 | Stetson ............... G01R 33/032 |
| 2018/0238989 | A1* | 8/2018 | Manickam ........... G01R 33/032 |
| 2018/0275207 | A1* | 9/2018 | Hahn ................... G01R 33/032 |

OTHER PUBLICATIONS

Anisotropic interactions of a single spin and dark-spin spectroscopy in diamond, R. J. Epstein, F. M. Mendoza, Y. K. Kato & D. D. Awschalom; Center for Spintronics and Quantum Computation, University of California, Santa Barbara, California 93106, USA.

Measuring the defect structure orientation of a single NV—centre in diamond, M W Doherty, J Michl, F Dolde, I Jakobi, P Neumann, N B Manson and J Wrachtrup; New Journal of Physics 16 (2014) 063067.

Broadband magnetometry by infrared-absorption detection of diamond NV centers, V. M. Acosta, a) E. Bauch, A. Jarmola, L. J. Zipp, M. P. Ledbetter, and D. Budker; Dated: Nov. 2, 2010, 1 arXiv:1009.4747v2 [physics.ins-det] Oct. 30, 2010.

High Sensitivity magnetic imaging using an array of spins in diamond, Physikalisches Institut, Universitat Stuttgart, Steinert S., Dolde F., Neumann P., Aird A., Naydenov B., Balasubramanian G., Jelezko F and Wrachtrup J.

Accuracy in the measurement of magnetic fields using NV centers in nanodiamonds, Haroon Aman, Taras Plakhtonik, School of Matnematics and Physics, The University of Queensland.

Fedder H et al.: "Towards-limited magnetic resonance imaging using Rabi beats", Applied Physics B; Lasers and Optics, Springer, Berlin, DE, vol. 102, No. 3, Feb. 11, 2011 (Feb. 11, 2011), pp. 497-502.

Fedotov I V et al.: "Fiber-optic magnetic-filed imaging", Optics Letters, Optical Society of America, US, vol. 39, No. 24, Dec. 15, 2014 (Dec. 15, 2014), pp. 6954-6957.

* cited by examiner

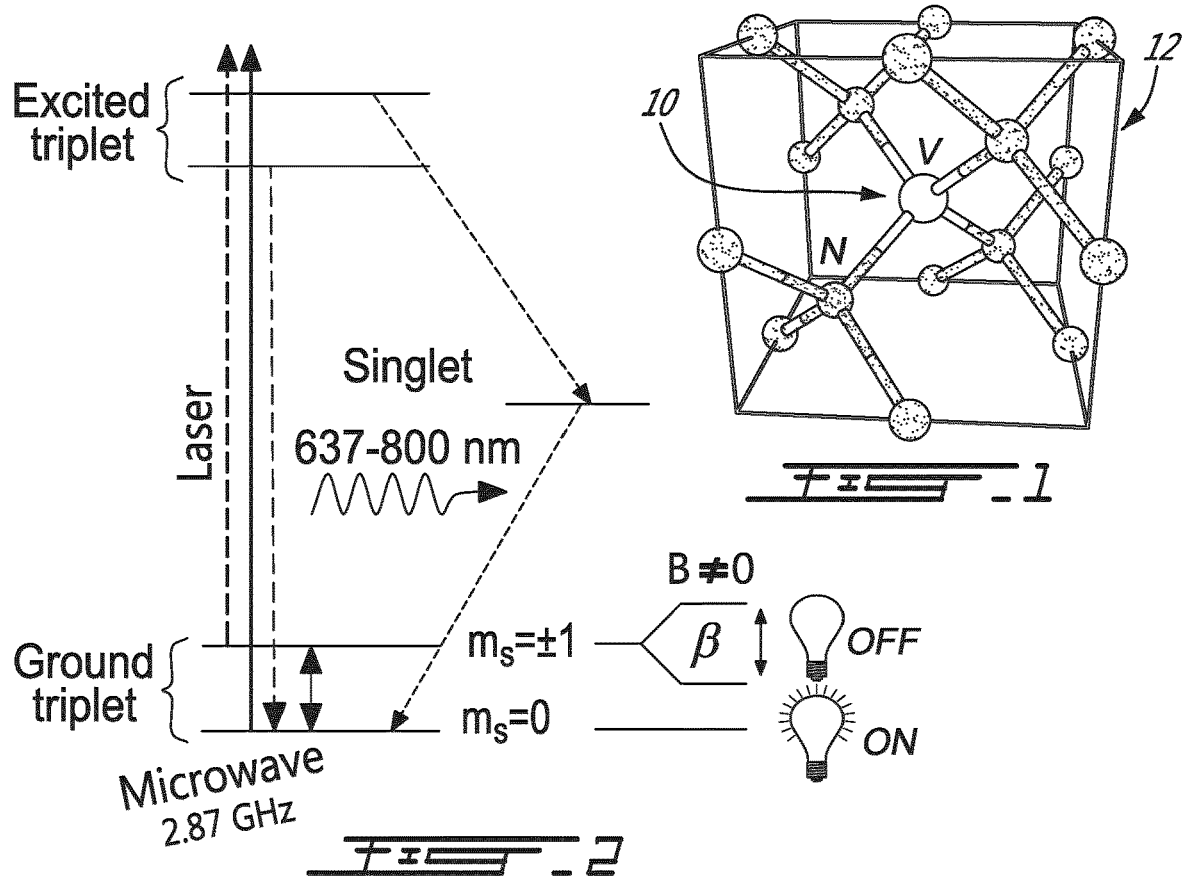
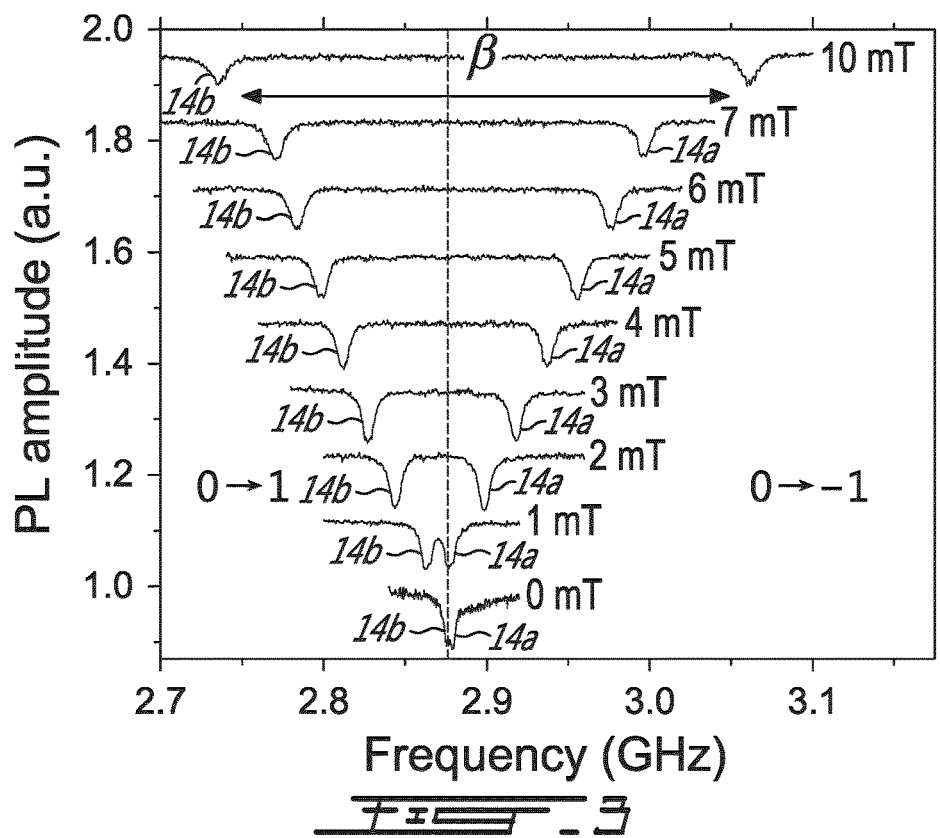

VECTORIAL MAGNETOMETER AND ASSOCIATED METHODS FOR SENSING AN AMPLITUDE AND ORIENTATION OF A MAGNETIC FIELD

FIELD

The improvements generally relate to magnetometers, and more specifically to the field of vectorial magnetometers based on electron spin sensitivity to the magnetic field.

BACKGROUND

Magnetometers are systems used to determine the amplitude and orientation of a magnetic field. Several technologies exist. One of these technologies presented in United States patent publication US 2010/0315079 uses optically detected magnetic resonance (ODMR) spectra. Another one of these, presented in U.S. Pat. No. 9,541,610, uses a similar technique. While such prior technologies were satisfactory to a certain degree, there remained room for improvement. In particular, the assignment of the crystalline defect orientations in this technology is performed by a method which includes sequentially generating a magnetic field in each one of three different orientations. This was found somewhat unsatisfactory or burdensome in at least some applications.

SUMMARY

This specification presents an example of a vectorial magnetometer where the assignment of the crystalline defect orientations can be performed without the sequence of three magnetic field orientations. Indeed, it was found that the spin-altering energy, which can be provided in the form of microwaves in embodiments based on NV defects in a diamond substrate for instance, could be provided in a pulsed manner to generate Rabi flopping of the electrons spin, affecting the detected intensity further based on pulse duration. The Rabi frequency of this flopping was affected by the amplitude of the received microwave power, and the spin-state-altering energy can be provided in a manner to provide different amplitudes to the different defect orientations, therefore providing all the information required to perform orientation assignment.

In accordance with another aspect, there is provided a method of performing vectorial magnetometer association of detected spin-state-altering energy level corresponding defect orientations, the method comprising: generating Rabi flopping at each one of the energy levels and performing the association based on the detected Rabi flopping.

In accordance with another aspect, there is provided a vectorial magnetometer, comprising: a sensory crystalline material substrate having defects sensitive to magnetic fields and oriented in at least three different orientations; a spin-state-altering subsystem configured and adapted to emit spin state altering energy within the sensory crystalline material in pulses of varying durations in a manner to generate Rabi oscillations of the defects, the amplitude of the energy emitted within the sensory crystalline material being different for each one of the at least three orientations; an interrogation subsystem configured and adapted to emit interrogation energy within the sensory crystalline material to generate a detectable intensity variation with the sensory crystalline material, the detectable intensity variation varying as a function of the spin-state of the defects, and a detector configured and adapted to measure the intensity of photons affected by the spin state; and a computer configured and adapted to: using the detection of the Rabi frequencies, generate association data in which the spin-state-altering energy values are associated with corresponding ones of the at least three defect orientations; using the association data, calculate the orientation of the magnetic field relative to the orientation of the sensory crystalline substrate; and generate a signal indicative of the orientation of the magnetic field.

In accordance with another aspect, there is provided a method of interrogating spin-state-altering energy values of at least three different defect orientations of defects of a crystalline substrate, the method comprising: for each one of said spin-state-altering energy values, i) providing a plurality of pluses of varying duration and of the corresponding spin-state-altering energy value to electrons of the defects at different relative amplitudes for different ones of the defect orientations, the different durations differently affecting the spin states of the defects via Rabi flopping, while ii) interrogating the spin-state of the defects by stimulating spin-affected transitions of the electrons, and measuring an intensity of energy varying as a function of said spin states, performing said association based on said measured varying energy intensity, and generating a signal based on said association.

In accordance with another aspect, there is provided a computer-implemented method of associating spin-state-altering energy values with corresponding ones of at least three different defect orientations of a crystalline substrate, the method comprising: a computer accessing and processing a) defect orientation data indicative of the at least three different defect orientations in a reference frame of the crystalline substrate; b) Rabi frequency data for each one of the spin-state-altering energy values; c) spin-state-altering energy orientation data indicative of relative amplitude projections along corresponding ones of the at least three different defect orientations of spin-state-altering energy provided to the defects to obtain the Rabi frequency data; and generating association data in which the spin-state altering energy values are associated with corresponding ones of the at least three defect orientations based on the accessed and processed data.

In accordance with another aspect, there is provided a method of performing vectorial magnetometer association of detected spin-state-altering energy level corresponding defect orientations, the method comprising: generating Rabi flopping at each one of the energy levels and performing the association based on the detected Rabi flopping.

In accordance with another aspect, there is provided a vectorial magnetometer comprising a system for performing vectorial magnetometer association of detected spin-state-altering energy level corresponding defect orientations based on the generation and detection of Rabi flopping at each one of the energy levels.

In accordance with another aspect, there is provided a method of associating spin-state-altering energy values to corresponding ones of at least three different defect orientations of defects of a crystalline substrate, the method comprising: for each one of said spin-state-altering energy values, i) providing a plurality of pluses of varying duration and of the corresponding spin-state-altering energy value to electrons of the defects at different relative amplitudes for different ones of the defect orientations, the different durations differently affecting the spin states of the defects via Rabi flopping, ii) interrogating the spin-state of the defects by stimulating spin-affected transitions of the electrons, and measuring an intensity of energy varying as a function of said spin states, and iii) calculating the Rabi frequency based on a plurality of said measured energy intensity values corresponding to different ones of the pulse durations; storing the calculated Rabi frequencies of each of said spin-state-altering energy values into a memory in the form of Rabi frequency data.

In accordance with another aspect, there is provided a vectorial magnetometer, comprising: a first photonic emitter configured and adapted to emit photons within the sensory crystalline material in a manner to generate Rabi oscillations of the defects, the Rabi oscillations being imparted differently in each one of the at least three orientations; a second photonic emitter configured and adapted to emit photons to excite the atomic defects subjected to Rabi oscillations, and generating an intensity of photons correlated to the spin state; a detector configured and adapted to measure the light intensity spectrum of the emitted photons; and a processor configured and adapted to, based on the frequency values of at least three couples of amplitude dips obtained from the detector, each couple being associated with defects of a given one of the at least three orientations, based on the known orientations of the at least three orientations, and further based on the frequency of the detected Rabi oscillations in each one of the at least three orientations, calculate the orientation of the magnetic field relative to the orientation of the sensory crystalline substrate and generate a signal indicative of the orientation of the magnetic field.

Many further features and combinations thereof concerning the present improvements will appear to those skilled in the art following a reading of the instant disclosure.

DESCRIPTION OF THE FIGURES

In the figures,

FIG. 1 is a view schematizing one of the four possible orientations of an NV defect in a diamond substrate;

FIG. 2 shows the energy states of the NV defect triplet state;

FIG. 3 illustrates how an ODMR experiment can be used in measuring the projection of a magnetic field against an NV defect of a given orientation;

DETAILED DESCRIPTION

Figure 4:
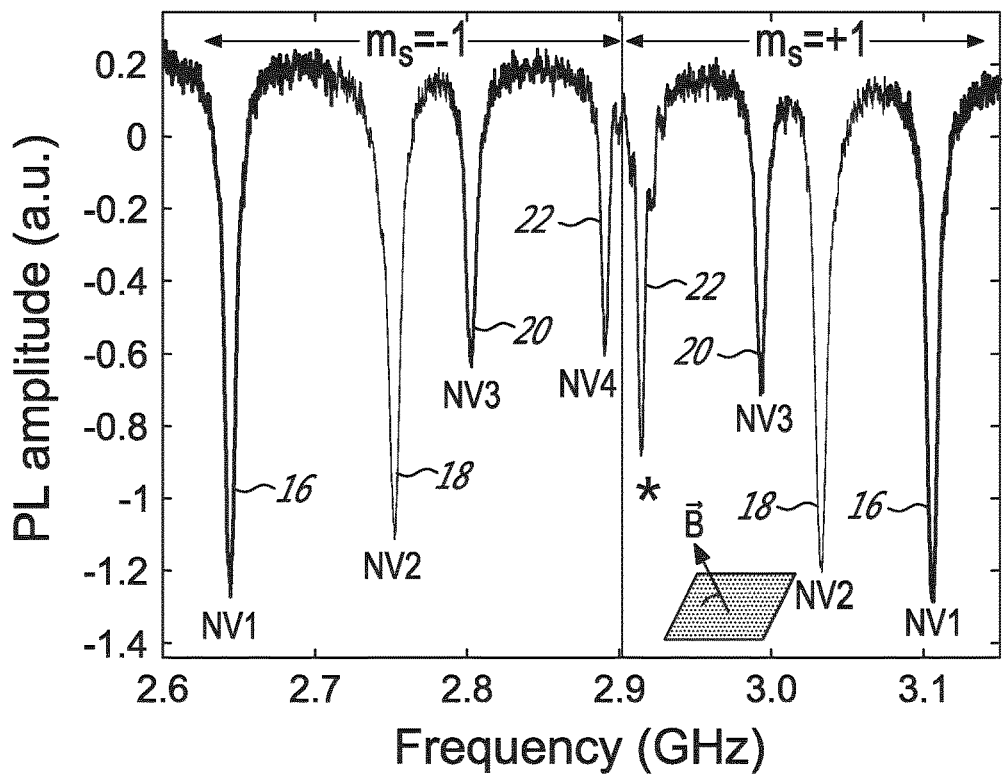
FIG. 4 illustrates the results of an ODMR experiment of a magnetic field affecting four NV defect orientations simultaneously.

Magnetic fields can be measured using optically detected magnetic resonance (ODMR) on crystalline substrates having defects in which the spin state of electrons is sensitive to the magnetic field. Nitrogen-vacancy (NV) defects in a diamond substrate constitute an example of such a crystalline substrate, although it will be understood that in alternate embodiments, other crystalline substrates can be used, to which the detection technique can be specifically adapted.

The NV defect is, in fact, a very interesting example and will be used for the sake of illustrating a possible embodiment. An example of an NV defect 10 in a diamond substrate 12 is shown in FIG. 1 on the right. It consists of two of the carbon atoms of the crystalline matrix which are substituted by a nitrogen atom and an adjacent vacancy, respectively. The NV defect 10 can be oriented in any one of four specific orientations associated with the crystalline matrix. Two free electrons in close proximity to the NV defect 10 form a triplet spin state. One of the reasons the NV defect 10 in diamond is a good example for testing is that such substrates 12 can be provided in a relatively inexpensive manner with a given, approximately known, concentration of NV defects 10. The substrate 12 will typically have a sufficiently high amount of NV defects 10 to be treated in a statistical manner, with the amount of NV defects 10 of each orientation being approximately equal. It will be understood that as technology evolves, other suitable defects may become usable in a comparable, perhaps even advantageous, manner.

FIG. 2 shows an energy diagram of this triplet spin state. More specifically, the base state can have any one of three states S=0, S=1 and S=−1. Via the Zeeman effect, the energy levels between the states S=1 and S=−1 is separated by a difference of energy which is related to the projection of the magnetic field β along the defect axis. The energy level can be identified in any suitable unit. ElectronVolts (eV) can be used for instance. However, as values of energy, such as the difference of energy between two states for instance, can correspond to a photon of a given wavelength/frequency, values of energy can alternately and equivalently be referred to by a photon frequency or a photon wavelength, for instance.

A typical ODMR experiment can interrogate the spin states in a diamond substrate having NV defects by exciting the triplets to the excited energy state, which can be done using green laser light, or resonant red laser light as known in the art. Based on the rule of conservation of angular momentum, the S=0 state can be excited to the S=0 excited state, the S=1 base state can be excited to the S=1 excited state, the S=−1 state can be excited to the S=−1 state. The excited state will eventually come back to the corresponding base state. The S=0 transition back to the base state will emit a photon in the red portion of the optical spectrum, the intensity of which can be detected. The S=1 and S=−1 transitions are quenched by an interstate coupling decaying to S=0 which is non-radiative. For the sake of clarity in later reference in this text, the emission of photons used to excite the triplet from the base state to the excited state will be referred to herein as the "interrogation emission", "interrogation energy", or "transition energy" to refer to the emitted energy which interrogates the spin state via the transition from the base state to the excited state, for instance. In alternate embodiments, the interrogation energy can be provided by photons in different wavelengths or, perhaps, phonons if a sufficient energy level of phonons can be harnessed in a specific application.

In NV defects the spin state S=0 can be selectively altered to switch to the S=1 or S=−1 spin states by applying energy of an energy value which corresponds to the energy difference between the S=0 state and the given one of the S=1 or S=−1 state. This "resonating" energy value depends on the projection of the external magnetic field to be measured along the corresponding defect axis. In the case of NV defects, this energy value corresponds to photons in the microwave portion of the electromagnetic spectrum and a corresponding microwave field can be applied using a waveguide in the form of a wire, for instance. This emission of an energy value adapted to alter the spin state of the defect can be referred to as the "spin-state-altering energy" by contradistinction to the "interrogation" or "transition" energy.

Accordingly, as shown in FIG. 3, the ODMR experiment can be conducted, for a given one of the NV orientations, by 'scanning' the frequency of the spin-state-altering energy while simultaneously interrogating the crystalline substrate as described above in relation with FIG. 2. In the case of NV defects, the interrogation can be performed by providing interrogating energy in the form of green light and detecting radiation in the red portion of the electromagnetic spectrum. It will be understood that by plotting the intensity of radiation, e.g., the photoluminescence (PL) amplitude, from the excited S=0 state to the base S=0 state, against the spin-state-altering energy value as shown in the graph, one will detect two dips $14a$ and $14b$ in the intensity for each defect orientation. The first dip $14a$ occurs at the frequency which corresponds to the exact difference of energy between the S=0 and S=−1 state, at which level of energy the stimulated transitions of the electrons become non-radiative, and the second dip $14b$ occurs at the frequency which corresponds to the exact difference of energy between the S=0 and S=+1 state, also decaying through non-radiative transitions. The difference of frequency between the dips $14a$ and $14b$ is related to the projection of the magnetic field along the corresponding axis of the NV defect as shown in the graph.

In practice, when conducting the ODMR experiment on a diamond substrate having NV defects, four distinct peak pairs 16, 18, 20 and 22 can be observed, as shown in FIG. 4, with each distinct peak of the pairs 16, 18, 20, and 22 being associated with a corresponding one of the four NV defects, and each one of the differences between the frequencies of the dips of a corresponding pair being related to the projection of the magnetic field amplitude along that corresponding defect axis.

The challenge at this stage is to determine how to associate the dips with the corresponding axes as for an unknown magnetic field amplitude and orientation, although the orientations of the NV defects relative to the crystalline substrate can be known and can serve as a basis for trigonometrical calculations, the correlation between the dips and the defect orientations are not known a priori.

Figure 5:
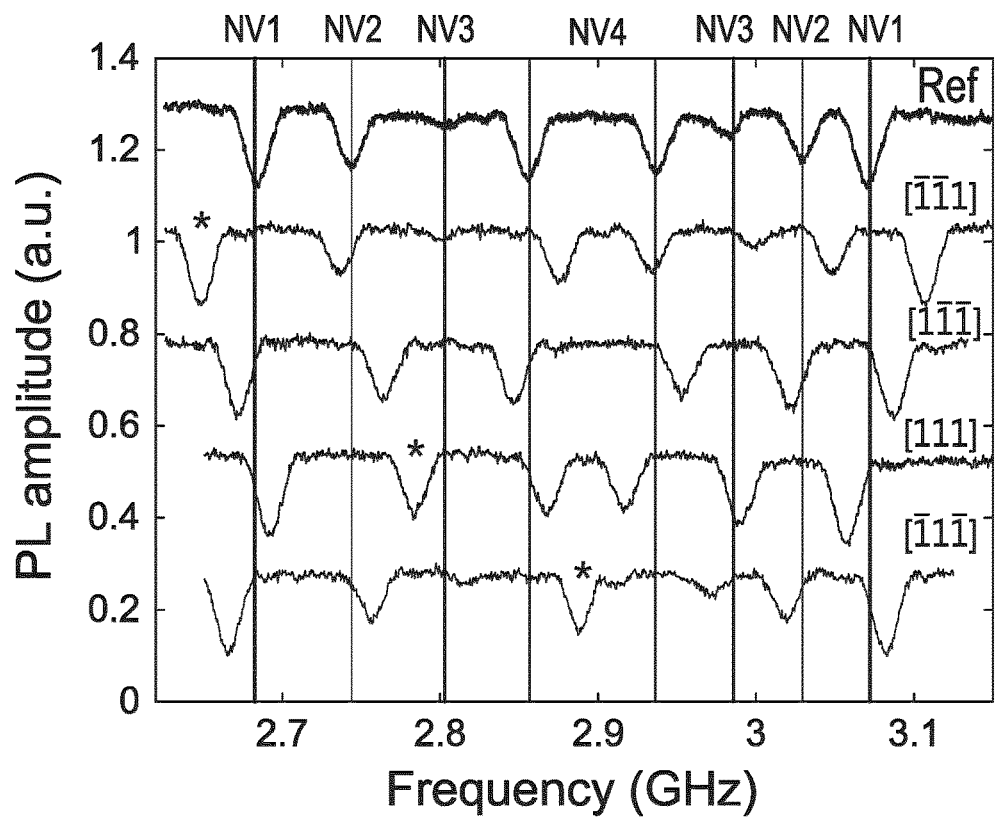
FIG. 5 illustrates how sequentially performing the ODMR experiment of FIG. 4 while simultaneously applying a controlled magnetic field in a known orientation can allow performing the association between the detected dips and the defect orientations.

One previously proposed solution consists in repeating the ODMR experiment while applying a known magnetic field in corresponding ones of the NV defect orientations. This has been proposed in the disclosure of U.S. Pat. No. 9,541,610, for instance. Indeed, as shown in FIG. 5, the different curves obtained in this manner can be compared to one another and the "displacement" of the dips from one curve to another as caused by the external magnetic field can be determined. This step can be performed by any suitable computer with corresponding software. The dips which have been displaced the most from the non-altered curve in any specific one of the subsequent curves will correspond to the NV defects having the orientation corresponding to the orientation of the external magnetic field associated with that specific curve, and pairs of dips in the original, reference curve can thus be associated with corresponding NV defect orientations, the amplitude of the frequency difference between the dips of each pair can be associated with a magnetic field amplitude corresponding to a projection along the corresponding orientation. Given that the orientations of the corresponding NV defects relative to the crystalline substrate are known, the amplitude of the projections measured by the energy value corresponding to the difference of photon frequency between the dips of a given pair, can be used, in combination with trigonometric calculations, to determine the vectorial amplitude of the magnetic field (amplitude and orientation in three dimensions). In fact, only three different defect orientations are required, and the example of NV defects in diamond offers a redundancy by having four different orientations. Moreover, it will be noted here that although both dips of a given pair are used to obtain an indication of amplitude of the magnetic field, the function of assignment of the dips to NV defect orientations can be performed using only a single dip of the pair, at least in some applications.

One disadvantage of this solution is the need to repeat the ODMR experiment while applying magnetic fields in different orientations, thereby affecting the magnetic sample probed. By contrast, imparting magnetic fields using a micro-wave excitation as presented below can be less intrusive, as the alternating field of the micro-wave can average out over time.

An alternate solution which does not require the application of magnetic fields in different orientations is proposed. In this alternate solution, the association of the defect orientations involves detecting the Rabi frequency which is influenced by the trigonometric projection of the amplitude of pulsed spin-state-altering energy.

Figure 6:
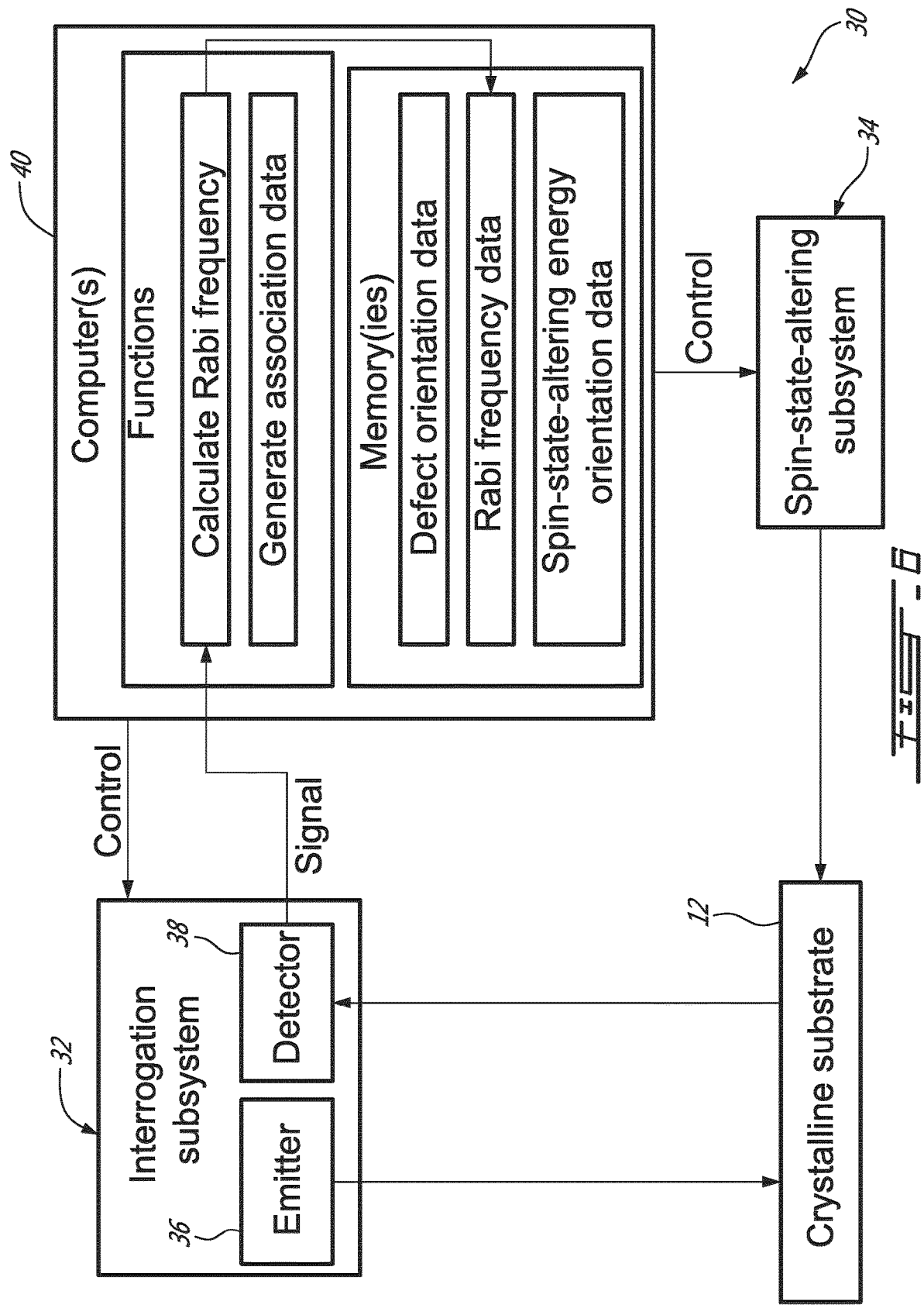
FIG. 6 is an example of a vectorial magnetometer.

Such an alternate solution can be embodied using a system 30 such as shown in FIG. 6. The crystalline substrate 12 has defects having spin-affected transitions in at least three-different orientations. These spin-affected transitions are also sensitive to the magnetic field to be vectorially measured. More specifically, two independent subsystems 32 and 34 can be used. Firstly, an interrogation subsystem 32 including an emitter 36 and a detector 38 can be used to provide the interrogation (transition) energy to stimulate the spin-affected transitions in the crystalline substrate 12 and to detect an energy intensity which is triggered by the spin-affected transitions and which varies based on spin-state. In the case of NV defects in diamond, the interrogation subsystem 32 can be a traditional ODMR subsystem for instance. Secondly, a spin-state-altering subsystem 34 is used to provide the spin-state-altering energy to the crystalline substrate 12. Typically, the spin-state-altering subsystem 34 will be used for two different functions. The first function being the mapping of the intensity over energy level (e.g., the graphs of FIG. 3, 4 or 5), and the second function being Rabi frequency measurement, which will be described in further detail below. Although both functions can conveniently be provided by the same subsystem in some embodiments, these functions can alternately be provided by different subsystems, and even be performed with different systems at different locations or moments in time. As shown, the two independent subsystems 32 and 34 can be controlled via a computer 40.

In some embodiments, the detector 38 is adapted to detect an intensity of energy such as radiation in the red portion of the optical spectrum generated by electrons returning to the base state from the excited state. In some other embodiments, the detector 38 is adapted to detect an intensity of energy such as radiation either reflected or absorbed at the spin-state-altering energy. In alternate embodiments, the detector 38 is adapted to detect an intensity of energy such as a voltage change generated by the electrons oscillating between different spin states (e.g., transitions S=0–>S=–1 et S=0–>S=+1). The intensity of the energy that is measured by the interrogation subsystem 32 can be an intensity of photon such as energy change affected by the spin state, photons, microwaves and/or voltage.

One particularity of the spin-state-altering subsystem 34 of FIG. 6 is that it can provide the spin-state-altering energy in a very specific matter to cause Rabi oscillation in the defects. These Rabi oscillations will have a frequency which does not depend on the energy level of the spin-state-altering energy, but rather on the projected amplitude of this spin-state-altering energy in the orientation of the interrogated defect. Moreover, the exact spin-state of the defects can be controlled based on pulse duration of the spin-state-altering energy. Indeed, the spin-state can be controlled in such a precise manner so as to allow measuring the Rabi frequency based on the known length of the pulses.

Indeed, in this example, the "spin-state-altering energy" can be not only variable in energy level (e.g., frequency) in order to allow performing the initial step of measuring the spin-affected intensity levels (e.g., identifying the different dips), but also A) operable at precisely controlled pulse durations which can be varied while maintaining the energy level locked at a given frequency and B) operable in a manner to provide the spin-state-altering energy in different and known relative amplitudes depending on the defect orientations.

For a given value of spin-state-altering energy (e.g., a given dip in the example presented above), spin-state-altering energy is provided at that energy level. However, that spin-state-altering energy is provided at specific conditions. These conditions include a given amplitude, and a given orientation in a manner to project different amplitudes on the given axes. Alternately, the different amplitudes can be imparted differently such as via different waveguides (e.g. wires), activated simultaneously or sequentially. For instance, spin-state-altering energy can be imparted sequentially along three waveguides each being oriented along one defect orientation. The assignation of the axis can then be made by determining a rapidly varying Rabi frequency for one of the peaks for each wire orientations, while the Rabi frequency will vary significantly less rapidly in the other wire orientations. Accordingly, in such a context, the assignation of the axes is still based on the detected Rabi frequencies, while not necessarily requiring the measurement of the actual Rabi frequency. In embodiments where the Rabi frequency is measured, the measurement can be performed by any suitable method, such as Fourier transform or sinusoidal curve fitting, to name two possible examples.

Figure 7:
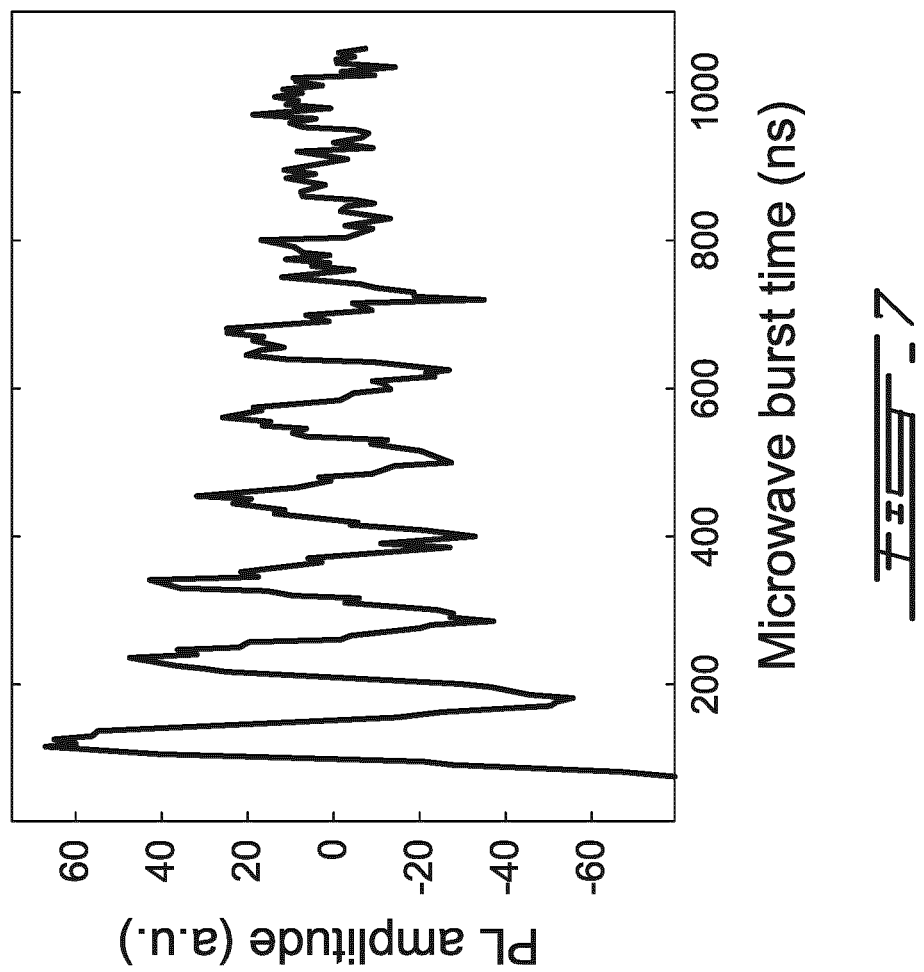
FIG. 7 illustrates an alternate method of performing the association between the detected dips and the defect orientations wherein Rabi oscillations are imparted in different frequencies in each orientation and the Rabi frequency of each given dip energy level is measured.

Moreover, these conditions include providing the spin-state-altering energy in pulses of varying durations in a manner to further alter the interrogated intensity due to Rabi flopping. Indeed, such as shown in FIG. 7, if sufficient values of pulse duration are provided while interrogating the spin state, the distance between corresponding features of the resulting curve (e.g., maxima, minima) can allow determining the period of the curve, or the Rabi frequency.

Figure 8:
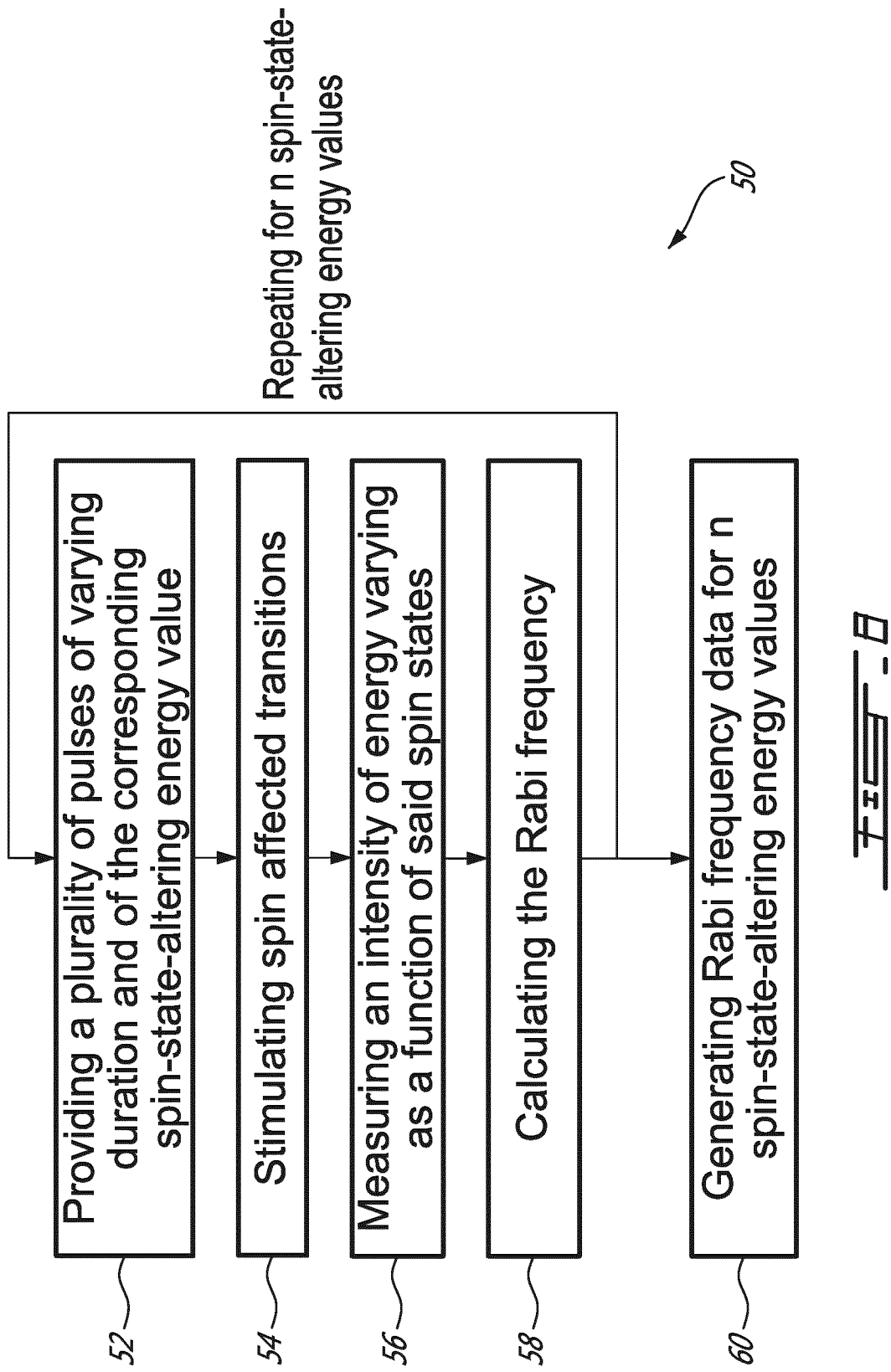
FIG. 8 is a flow chart of an example method to generate Rabi frequency data.

The method shown 50 in FIG. 8 can be performed using the system 30 shown in FIG. 6, which includes repeating the following steps 52-60 for each required spin-state-altering energy value (e.g., dip):
Providing a plurality of pulses of varying duration and of the corresponding spin-state-altering energy value;
Stimulating spin affected transitions;
Measuring an intensity of energy varying as a function of said spin states; and
Determining the Rabi frequency.

Rabi frequency data can be generated for each one of the required spin-state-altering energy values.

Figure 9:
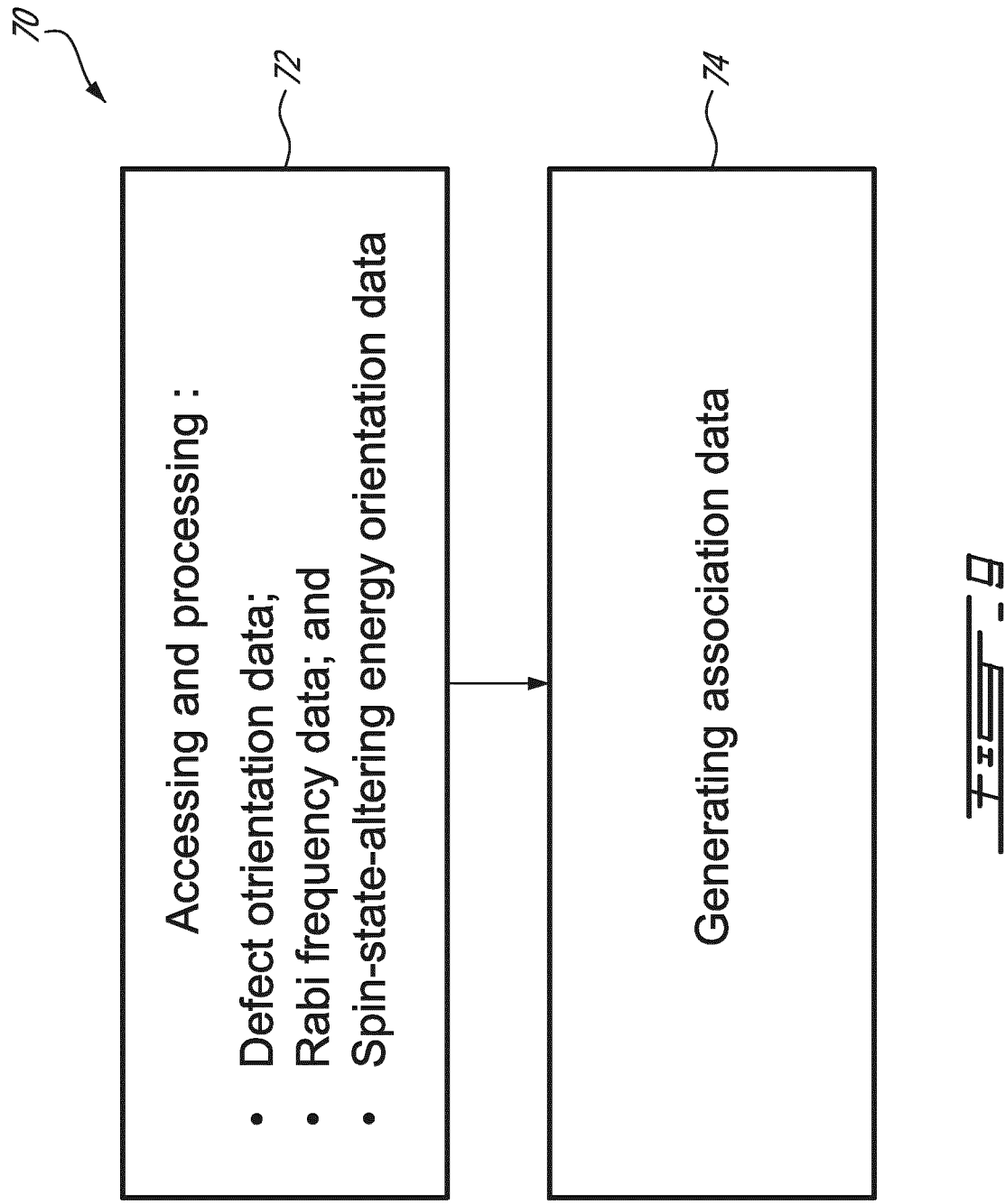
FIG. 9 is a flow chart of an example method to generate association data.

As the Rabi frequency is dependent on orthogonal projection of the amplitude of the energy causing the Rabi flopping in the corresponding defect orientation, and the relative amplitude of the defect orientations can be known, the Rabi frequency data can be used to associate the given dip or spin-state-altering energy level with a corresponding one of the defect orientations. This association can be performed by a computer, e.g. computer 40 in FIG. 6, having suitable software, for instance. The association method 70 can include the steps 72-74 shown in FIG. 9, that is:
Accessing and processing:
Defect orientation data;
Rabi frequency data; and
Spin-state-altering energy orientation data.
To generate the association data.

The defect orientation data can provide information required to be able to perform the trigonometrical operations to be able to calculate amplitude projections in the corresponding defect orientations, or be provided in the form of a pre-calibrated table of values, for instance.

The Spin-state-altering energy orientation data can provide information required to be able to perform the trigonometrical operations to be able to calculate amplitude projections of the spin-state-altering energy relative to the defect orientations, or can be provided in the form of a pre-calibrated table of values, for instance.

Referring to the example presented above in relation with NV defects in diamond, and where the spin-state-altering emission can take the form of photons in the microwave spectrum guided in a wire, for instance, the frequency of the microwaves can be locked to the frequency of a given one of the dips, and the pulse duration of the microwaves can be "scanned", such as by progressively increasing the duration for instance, while continuing to monitor the detected intensity, such as shown in FIG. 7. Depending on the pulse duration, the detected intensity will vary. Indeed, the pulsed microwave can further be used to manipulate spin state, and more specifically by causing spin inversion, known as Rabi flopping or Rabi oscillations, which can, for specific pulse durations, cause the S=1 or S=−1 state to flop to S=0, and thus causing the dips to disappear. More specifically, specific pulse durations, separated from one another by a given period, will produce complete (Pi pulse) Rabi flopping whereas intermediate pulse durations will not. Accordingly, the plot of the detected intensity vs. pulse duration shown in FIG. 7 shows a periodic oscillation with a frequency corresponding to the Rabi frequency.

The Rabi frequency is related to the received amplitude of the "spin-state-altering energy", i.e. of the amplitude of the microwave emission in this example. For microwave emission of a given amplitude in a given orientation, the received amplitude will depend on the specific defect orientation. As presented above, in order to allow determining the vectorial amplitude of the magnetic field, at least three dip pairs are associated with corresponding, different, defect orientations. Accordingly, in the case of NV defects in diamond, different Rabi frequencies will be measured at the energy levels of the dips as a function of the projections of the microwave amplitude in the orientations associated to the dips changes. The different Rabi frequencies measured can be associated with corresponding, different amplitude projections of the microwave emission in different defect orientations. If the microwave emission orientation is known relative to the orientation of the defects, the different microwave amplitude projections measured can be used to determine the relative orientation of the defects. This result can be achieved for at least three different defect orientations, and thus be used to determine vectorial external magnetic field amplitude, by appropriately selecting the relative orientation of the microwave waveguide, and more specifically by selecting it to an orientation which creates different microwave amplitude projections in at least three different ones of the defect orientations. If the relative angle between the microwave waveguide and the defect orientations is known, and, the value of the microwave amplitude projections for the different defect orientations can be determined based on trigonometric relationships. In this specific embodiment, a thin metal wire waveguide was used and positioned on the planar surface of the crystalline substrate, at a given inclination, and the resulting magnetic field orientation can be calculated based on the Bio-Savart relationship. This can be suitable for some applications. In a scenario such as the one illustrated, where the microwaves are produced along a single, strategically oriented waveguide, the determination is made based on the relative amplitudes in accordance with the different projections, and it may not be required to know the microwave absolute amplitude. Once the association data has been obtained, the spin-state-altering energy level data, which can be in the form of data such as can be represented in the graph of FIG. 4, for instance, can be used together with the association data and with the defect orientation data to determine (reconstruct) the 3D vectorial amplitude of the external magnetic field. In some embodiments, the waveguide is a metallic strip adjacent to a planar surface of the crystalline substrate which covers the planar substrate of the crystalline substrate. In some other embodiments, the metallic strip can be part of a printed circuit board adjacent to the planar surface of the crystalline substrate. In some alternate embodiments, the metallic strip can be provided in the form of an antenna adjacent to the planar surface of the crystalline substrate.

This specific example will now be presented in greater detail.

Indeed, diffraction limited mapping of dynamical magnetic phenomena can be imaged on a large field of view with the use of shallow NV center ensembles in a pure diamond film. Orientation identification for vectorial magnetic field reconstruction can be performed via application of a known external magnetic field which can, however, affect the object under study. Alternately, applying a known microwave field can enable finding the alignment of the magnetic field with respect to the four possible NV orientations by measuring the Rabi frequency of three optically detected magnetic resonance features. The latter technique can allow quick, non-invasive, vectorial tracking of the magnetization in magnetically functionalized samples.

Magnetometers based on single nitrogen-vacancy (NV) centers in diamond have proven $nT/\sqrt{Hz}$ sensitivity in nanometric volumes (see J. Taylor, P. Cappellaro, L. Childress, L. Jiang, D. Budker, P. Hemmer, A. Yacoby, R. Walsworth, and M. Lukin, "High-sensitivity diamond magnetometer with nanoscale resolution," Nature Physics, 4, 810 (2008).), which makes them an attractive system for studying magnetic phenomena in the fields of biology (see D. R. Glenn, K. Lee, H. Park, R. Weissleder, A. Yacoby, M. D. Lukin, H. Lee, R. L. Walsworth, and C. B. Connolly, "Singlecell magnetic imaging using a quantum diamond microscope," Nature Methods, 12, 12 (2015).), materials science and condensed matter (see L. Rondin, J.-P. Tetienne, S. Rohart, a. Thiaville, T. Hingant, P. Spinicelli, J.-F. Roch, and V. Jacques, "Stray-field imaging of magnetic vortices with a single diamond spin." Nature communications, 4, 2279 (2013).). Using small NV ensembles, the vectorial magnetic field can be extracted by using the Zeeman splitting of at least three NV orientations (see B. J. Maertz, a. P. Wijnheijmer, G. D. Fuchs, M. E. Nowakowski, and D. D. Awschalom, "Vector magnetic field microscopy using nitrogen vacancy centers in diamond," Applied Physics Letters, 96, 092504 (2010).). Labeling of the NV orientations-dependent spectral features can be made by applying a known magnetic field along different directions and measuring optically detected magnetic resonance (ODMR) spectra with different orientations of an external magnetic field with respect to the NV axis (see R. J. Epstein, F. M. Mendoza, Y. K. Kato, and D. D. Awschalom, "Anisotropic interactions of a single spin and dark-spin spectroscopy in diamond," Nature Physics, 1, 94 (2005).). By using a combination of rotating external magnetic and electric field, the assignment can also be made (see M. W. Doherty, J. Michl, F. Dolde, I. Jakobi, P. Neumann, N. B. Manson, and J. Wrachtrup, "Measuring the defect structure orientation of a single NV-centre in diamond," New Journal of Physics, 16, 1 (2014), arXiv:1402.4789.). Such procedures can modify B-field sensitive samples and implies the use of pairs of Helmoltz coils, increasing the amount of data to be treated for wide field magnetometry. A known microwave driving field with distinct ($B_{MWX}$, $B_{MWY}$, $B_{MWZ}$) components is applied by a tilted wire to obtain distinct Rabi frequencies for each NV orientation. This can lead to satisfactory fast assignment of the orientation for each NV resonant peak for vectorial magnetic field measurement over a wide depth range.

The NV center in diamond is composed of a single substitutional nitrogen atom and an adjacent vacancy (see FIG. 1). This frees two electrons forming a triplet state with the Hamiltonian:

$$H_s/h = D(S_z^2 - 2/3) + g\mu_B \vec{\beta} \cdot \vec{NV}_i + \epsilon(\vec{S}_x \cdot \vec{S}_x - \vec{S}_y \cdot \vec{S}_y)$$

where D=2.87 GHz, $\epsilon$ is the strain parameter, $S_x$, $S_y$, $S_z$ are the spin one matrices, g is the electron gyromagnetic factor and 7 W is the vector of one of the NV orientations.

Figure 11:
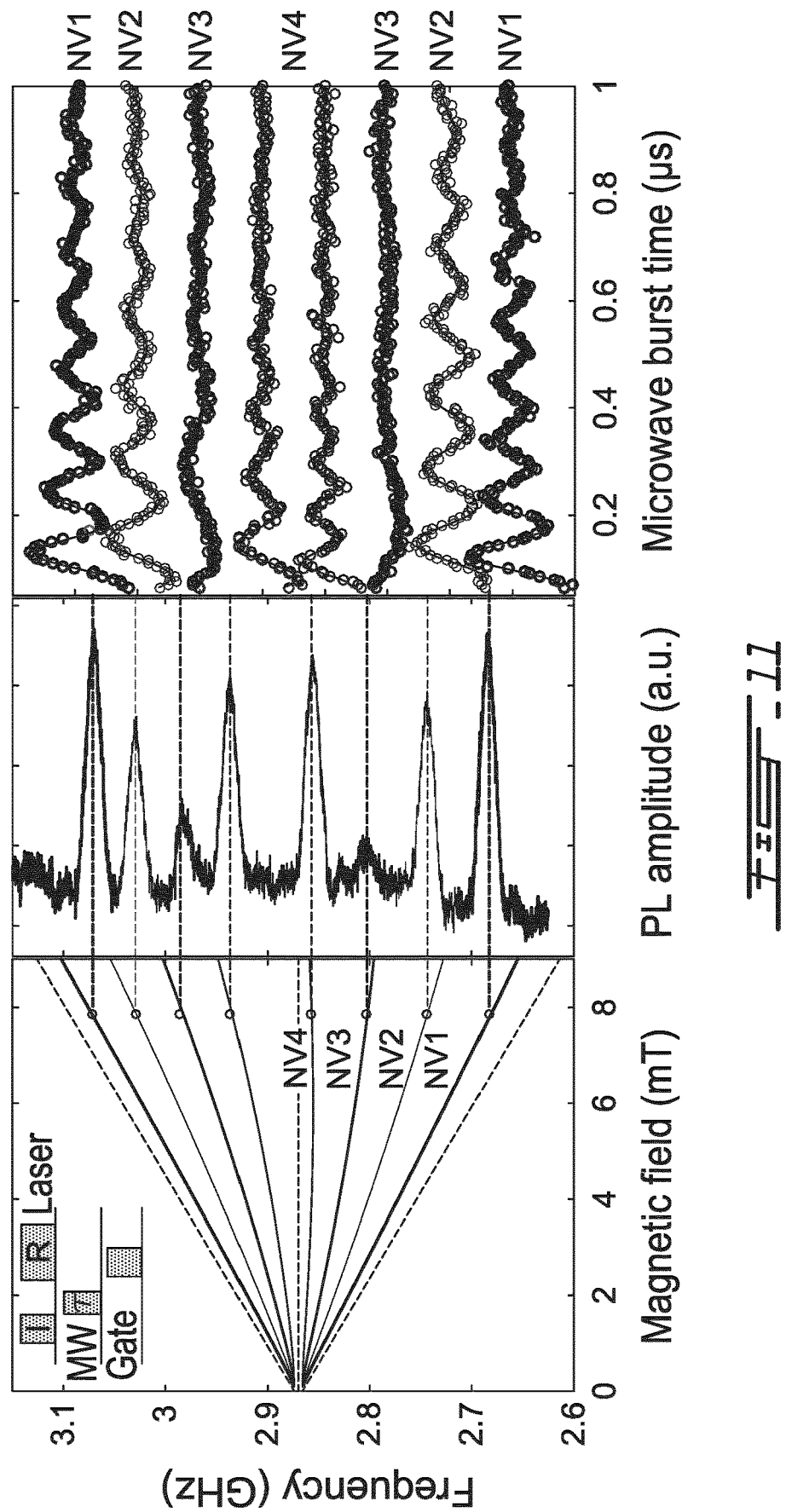
FIG. 11. illustrates the theoretical Zeeman splitting and experimentally obtained ODMR/Rabi curves for the different NV orientations. a) Simulated Zeeman splitting with $\vec{B}$=(0.89; 0.407; −0.2) and $|\vec{B}|$=7.86 mT. Dotted lines: Zeeman splitting for $\vec{B}\|NV$. Dots: center ODMR peak values. Inset: pulse sequence used for the Rabi experiment, with laser pulses separated by 2 µs. b) ODMR curve taken with MW burst time τ=200 ns. c) Offset Rabi curves for the four NV orientations.

The ground triplet state is linked to the excited state by a radiative transition at 637 nm. Due to preferential coupling of the excited state 637 nm to the singlet state via a non-radiative transition decaying to the $m_s$=0 state, optical readout contrast and initialisation is obtained between the spin states following a non-resonant excitation (see FIG. 11). Under an arbitrary magnetic field, each set of oriented NV centers are affected by a different magnetic field (as shown in FIG. 3), which allows selective excitation with a resonant microwave (MW) in an optically detected magnetic resonance (ODMR) experiment.

However, in order to reconstruct the full vectorial magnetic field $B_x$, $B_y$, $B_z$, a minimum of three different resonant NV peaks must be associated with their orientation. The four possible NV orientations are [111], [−11−1], [−1−11], [1−1−1]. For an arbitrary direction of a B-field 24 vector combinations with a distinct amplitude and angle can be chosen to fit the positions of the ODMR peaks. For an arbitrary direction of the B-field, up to 4 distinct ODMR peak pairs can be measured. Due to the $C_{3v}$ geometry, the number of peaks will be reduced in particular if the B-field is pointing along any of the NV axis. The $m_s$=±1 state being degenerate at zero magnetic field, a single ODMR peak with the 4 NV orientations is thus observed in this situation at 2.87 GHz. This degeneracy can be lifted by applying an external magnetic field along the quantification axis of three out of four possible NV orientations. However, orientations can also be distinguished by applying an arbitrary known microwave field with distinct components and measuring the Rabi frequency for the four classes of NVs. The scalar product of the NV orientation and MW field is given by $$\vec{NV}_i \cdot \vec{B}_{MW} = |\vec{NV}_i||\vec{B}_{MW}|\cos(\theta_i)$$

where i is one of the four possible orientations. The Rabi frequency for a given orientation can be expressed by $$\Omega_i = \Omega_R \sin(\theta_i)$$

where $\Omega_R$ is the bare Rabi frequency for a driving field perpendicular to the NV axis and $\theta_i$ is the angle between the NV axis and the MW field. As shown below, $\Omega_R$ can be estimated from the ratio of the Rabi frequencies of peaks around the zero-field splitting at 2.87 GHz.

Figure 10:
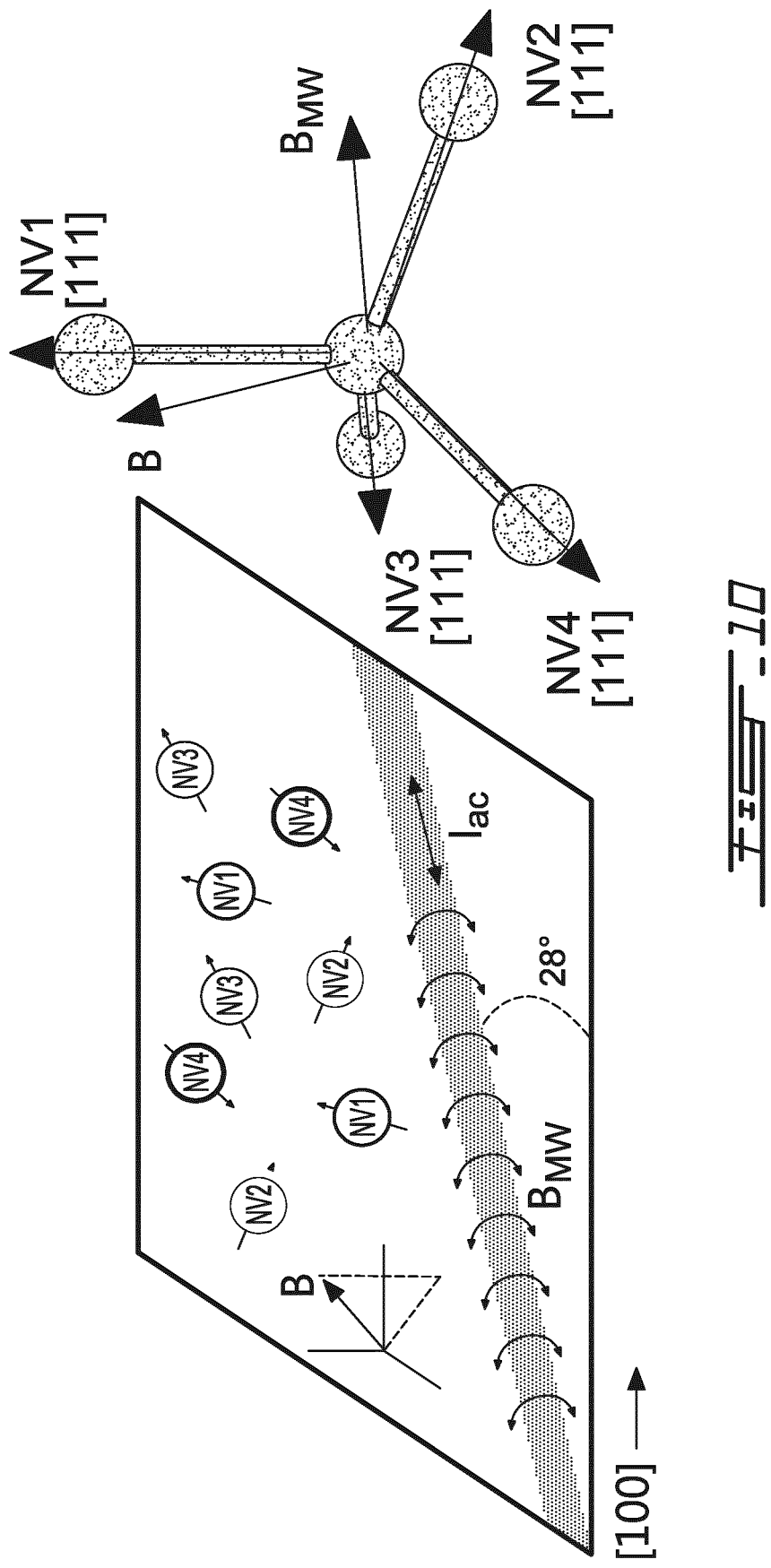
FIG. 10 illustrates setup schematics and different NV orientations. Left: tilted microwave line on diamond substrate with an ensemble of NV centers illuminated by a laser. Right: tetragonal structure with the four possible NV orientations, with vectors for the experimentally applied magnetic field B and microwave field $B_{MW}$.

A CVD diamond samples from Element6 with a NV centers density of $2\times10^{13}$ NV/cm$^3$ as previously measured (see V. Acosta, E. Bauch, M. Ledbetter, C. Santori, K.-M. Fu, P. Barclay, R. Beausoleil, H. Linget, J. Roch, F. Treussart, S. Chemerisov, W. Gawlik, and D. Budker, "Diamonds with a high density of nitrogen-vacancy centers for magnetometry applications," Physical Review B, 80, 1 (2009).) was used for this work. Microwaves were applied by a photolithographically defined Ti+Au (20/180 nm) wire of width 5.8 μm, thickness 200 nm and a static magnetic field of 7.86 mT (found by the outlined technique) separated the four NV orientations, as shown on FIG. 10. The wire was tilted 28 degrees relative to the axis to obtain distinct $B_{MW}$=(0.297, −0.558, −0.775) field components at the probing depth of the confocal spot (105 μm), as calculated with the Radia package (Available at http://www.esrf.fr). Subsequently, Rabi oscillations were measured for each ODMR peaks by varying the width (duration) of the MW pulse as shown in FIG. 6. Rabi frequencies are calculated using FFT analysis (see extracted values in Table 1). The ratio of Rabi frequencies is much lower (higher) than 1 for peaks 3(4), which translates in an error mixing the orientations obtained by the Rabi frequency fitting procedure. Accordingly, the angle between NV peak 4 and external magnetic field has to be taken into account. For a magnetic field aligned with the NV axis, dipolar transition strengths (proportional to Rabi frequency) for $m_s$=±1 are the same. However, when $\vec{B} \perp \vec{NV}$ the eigenstates $m_s$=±1 become mixed into the basis |+⟩=1/$\sqrt{2}$(|1⟩+|−1⟩) and 1/$\sqrt{2}$(1−⟩=|1⟩−|−1⟩), coupling preferentially to the spin transition elements $S_x$ and $S_y$ respectively. Combined with MW drive components $B_x \neq B_y$, this results in different Rabi frequencies for the same NV orientation.

More generally, to compute the ratio of Rabi frequencies, the transition strengths (proportional to the Rabi frequency) are calculated. The transition strength in function of initial (final) eigenstates $\Psi_i$ ($\Psi_f$) is given by $w_{i \to f} = |\langle \Psi_i|V_I|\Psi_f\rangle|^2$, where $V_I$ is the microwave time dependent potential and $w_{i \to f}$ fulfills the Thomas-Reiche-Kuhn sum rule. The eigenstates as a function of angle are calculated to compute the transition strengths:

$$w_x = h_x^2 |\langle \Psi_i|S_x|\Psi_f\rangle|^2; w_y = h_x^2 |\langle \Psi_i|S_x|\Psi_f\rangle|^2;$$
$$w_z = h_z^2 |\langle \Psi_i|S_z|\Psi_f\rangle|^2$$

where $w_x$, $w_y$, $w_z$ is the transition strength for Pauli matrices $S_x$, $S_y$, $S_z$ and $\sqrt{h_x^2 + h_y^2 + h_z^2} = 1$. Then the total transition strength for states |+⟩(|−⟩) is given by:

$$w_+ = w_{x+} + w_{y+}$$

$$w_- = w_{x-} + w_{y-}$$

for transitions $|\Psi_i\rangle = |0\rangle \to |\Psi_f\rangle = |+\rangle$, $|\Psi_i\rangle = |0\rangle \to |\Psi_f\rangle = |-\rangle$ respectively. The Pauli matrix $S_z$ (which drives transition far in energy from the micro-wave drive $|\Psi_i\rangle = |-\rangle \to |\Psi_f\rangle = |+\rangle$) was neglected as $w_z \ll w_x$, $w_y$ for small field angles under 85 deg. FIG. 3 shows the effect of the angle on the transition strength for $w_x$, $w_y$ including (gray, black curves) the strain measured in our sample (8 MHz). As angle $\beta \to \pi/2$, the calculated ratio $\sqrt{w_+/w_-}$ (proportional to the ratio of Rabi frequency) increases drastically. Taking the experimental ratio 1.37 for peak set 4, the calculated angle between NV4 and the external magnetic field is $\beta$=81 deg. This pinpoints the orientation of NV4 as the magnetic field can be found with the ODMR spectrum of FIG. 2b up to a combination of orientations. Taking the scalar product $\vec{B} \cdot \vec{NV}_i$, the [1−11] orientation is the closest, with $\beta$=87.4 deg (see methods for B field extraction presented below).

TABLE 1 peak frequencies, their associated Rabi frequencies in MHz and Rabi frequency ratios $\sqrt{w_-/w_+}$ for the NV peak sets.

| | Peak Freq. | | | Rabi Freq. | | | |
|---|---|---|---|---|---|---|---|
| Peak | I−> | I+> | \Delta_i | I−> | I+> | Mean | Ratio |
| 1 | 2683.3 | 3071.7 | 388 | 9.19 | 8.73 | 9.00 | 1.05 |
| 2 | 2743.7 | 3029.7 | 286 | 7.20 | 7.03 | 7.12 | 1.02 |

TABLE 1-continued peak frequencies, their associated Rabi frequencies in MHz
and Rabi frequency ratios $\sqrt{w_-/w_+}$ for the NV peak sets.

| | Peak Freq. | | | Rabi Freq. | | | |
|---|---|---|---|---|---|---|---|
| Peak | I – > | I + > | \Delta_i | I – > | I + > | Mean | Ratio |
| 3 | 2803.0 | 2986 | 183 | 2.2 | 3.3 | 2.5 | 0.7 |
| 4 | 2857.0 | 2936 | 79 | 10.8 | 7.9 | 9.4 | 1.37 |

Figure 12:
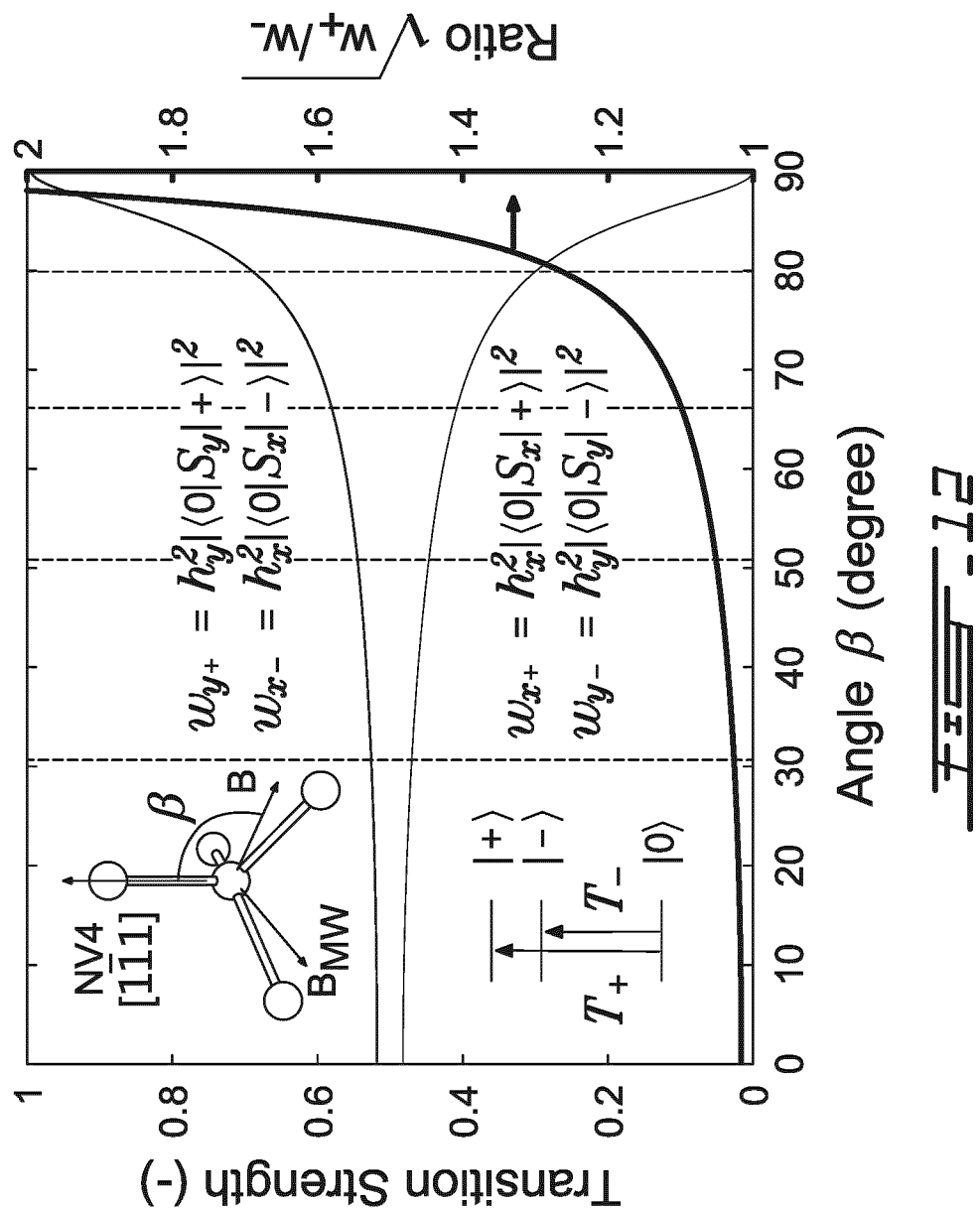
FIG. 12 shows calculated transition strength in function of magnetic field angle with the NV axis β for eigenstate |−> and eigenstate |+>; upper and lower branches are for the $w_x$, $w_y$ transition matrices of total transition strength $w_+$ or $w_-$; right scale: transition strength ratio $\sqrt{w_+/w_-}$ ratio in function of angle, taking into account the microwave components applied; dotted lines: magnetic field angles for the different NV orientations; and orientation NV4 shows the biggest expected Rabi ratio.
Figure 13A:
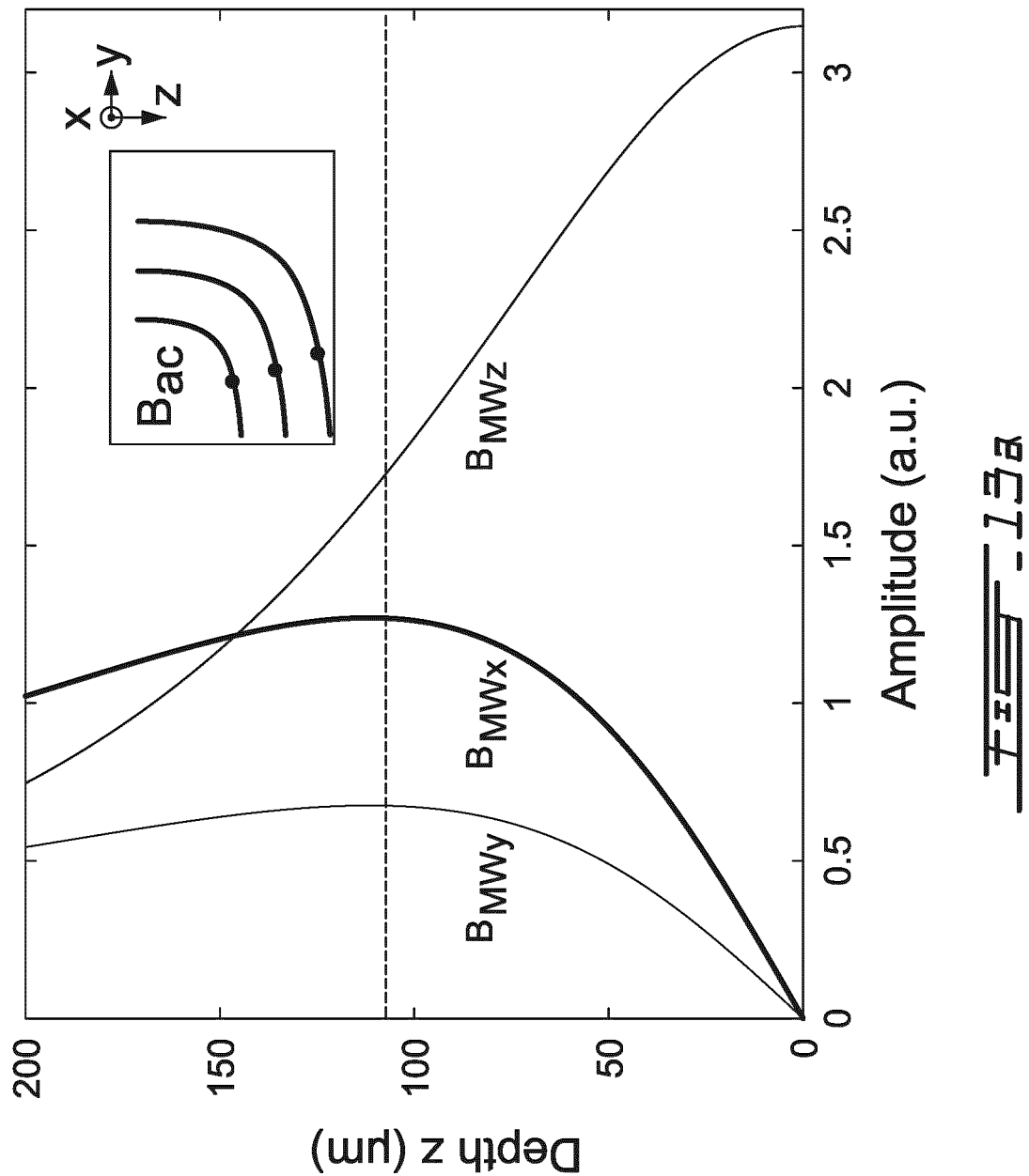
FIG. 13*a* illustrates the depth dependence for the applied microwave field and FIG. 13*b* for the SSD ratio. a) Absolute value of microwave field components 146 µm away from the MW line. Line at 105 µm: depth at which the experiment was carried. b) Ratio of the SSD of the correct orientation combination over the second smallest SSD orientation, calculated with set of peaks 1,2,3 2,3,4 1,3,4 1,2,4 1,2,3,4, which shows that the right solution (SSD<1) is obtained for depth range 60-145 µm.
Figure 13B:
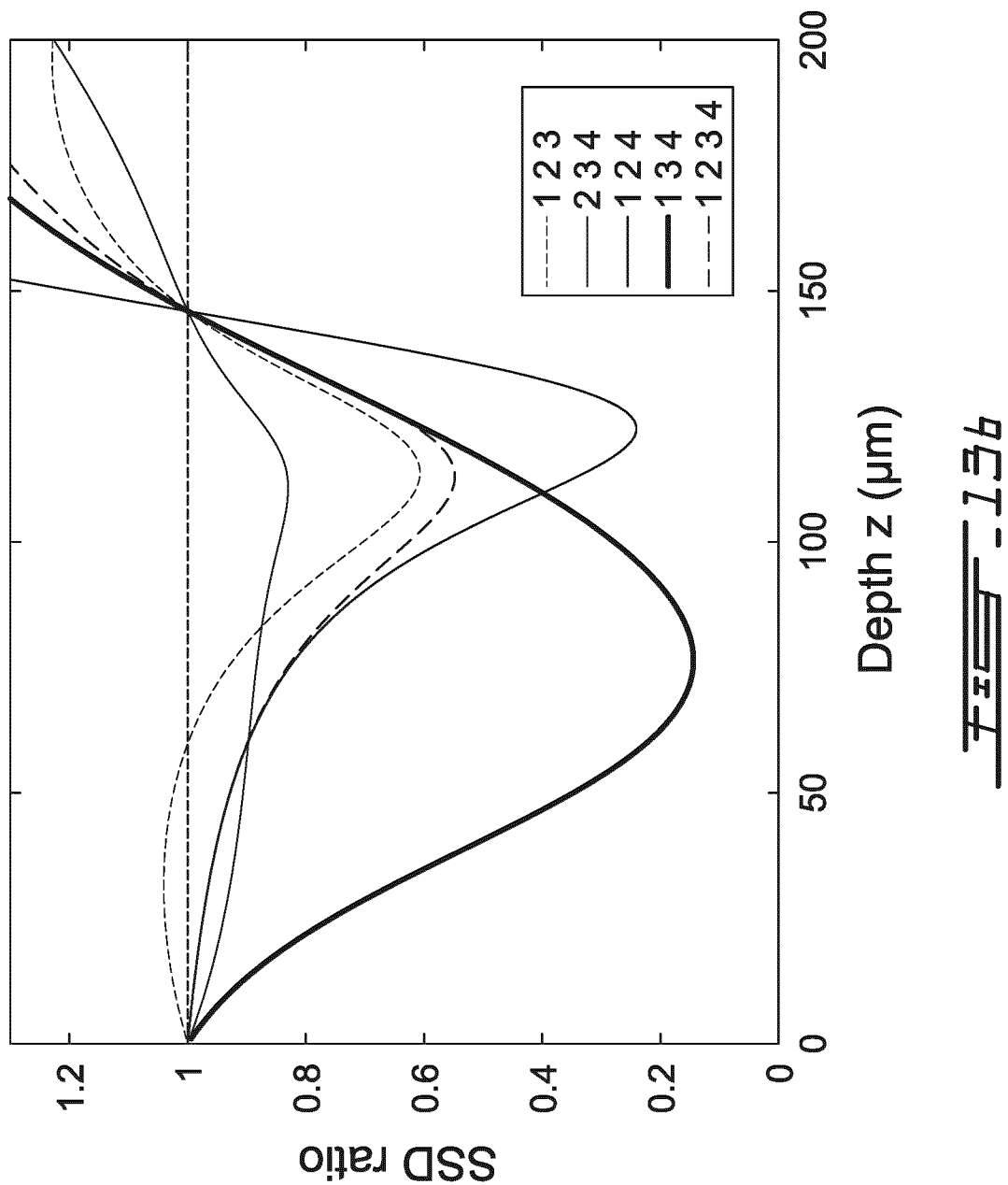

To find the right NV orientation combination, the Sum of Squared Differences (SSD) is calculated:

$$SSD = \Sigma_i (\sin(\theta_{(z,i)}) - \Omega_i/\Omega_R)$$

where $\theta_{(z,i)}$ is the angle between the MW and the NV axis $NV_i$ at depth z. Hence, $\Omega_R$ is needed to calculate the sum of the 24 different combinations i. The $\Omega_i$ used for calculation are the average of both Rabi values as the transition strength is symmetric for $|\pm\rangle$ states for an angle under 86 deg (see methods FIG. 5). As orientation NV4 and $B_{\vec{MW}}$ is known, $\Omega_R = \Omega_4/\sin(\theta_4)$ where $\theta_4 = \arccos(NV4 \cdot B_{MW}) = 87.4$ deg, so that $\Omega_R = 9.36$ MHz. Estimation of $\theta_R$ is optional as the parameter can be added in the minimization of SSD. Minimization of the SSD in function of probing depth was carried out for 5 possible peak combinations: set of peaks i=1,2,3; 2,3,4; 1,2,4; 1,3,4; 1,2,3,4. As shown in FIGS. 12, 13a and 13b, probing depth must be carefully chosen to avoid equal components of microwave amplitudes or big gradients which would result in lower Rabi curves visibility. Probing at depth of 105 μm ensures that measurement is carried with small gradients and with clearly separated microwave components away from the crossing point at 146 μm. To confirm the stability of the result obtained, the orientation with the smallest SSD at 105 μm is divided by the smallest SSD orientation beyond 146 μm for the whole depth range. For all sets, the solution found at the probing depth is NV1=[11-1] NV2=[111] NV3=[1-1-1] NV4=[1-11]. The magnetic field is then calculated as will be presented below, giving $|\vec{B}|=7.86$ mT(0.89,0.407,-0.2). Except for peak combination 1,2,3, the result is valid for depth range 0-146 μm, as expected from the MW components singularity at 146 μm. Subsequently, the fitting result was verified by applying an external magnetic field (1.25 mT, see methods) along each NV axis (see FIG. 4) and attributing the largest peak shift to the magnetic field orientation applied. Accordingly, peaks 1,2,4 are linked to [11-1] [111] [1-11], and peak 3 is linked to the remaining orientation, [1-1-1].

As measurements are carried under the microwave field gradient of the wire, the NV ensemble probed feels different MW field strengths which can modify the values $\Omega_i$. In this case, measurements were obtained 146 μm away from the line at a depth of 105 μm to obtain constant microwave amplitudes $B_x,B_y$ over the confocal volume of 3 μm³ (approximately 60 NV probed, see FIG. 3). For measurements carried at the surface of the sample 10 μm away from the wire, Rabi oscillations average out due to the strong MW gradient. This prevents magnetic field measurements near the MW wire and the surface. Such constraint can be lifted by using a different wire geometry and shallow implanted layers of NV centers as used for high sensitivity magnetometry (see D. M. Toyli, C. D. Weis, G. D. Fuchs, T. Schenkel, and D. D. Awschalom, "Chip-scale nanofabrication of single spins and spin arrays in diamond," Nano Letters, 10, 3168 (2010), 1007.0240.). The technique outlined here will allow fast NV ensemble vectorial magnetic field measurements by tracking dynamically the orientation of NV centers in the ODMR spectrum. Furthermore, applying an external bias field which can alter the dynamics of the magnetic objects probed is no longer needed.

The approach outlined can be sped up substantially by these steps: first, the orientations are found by measuring the whole Rabi curves for all the orientations. Then, an optimal microwave burst time is chosen to obtain different ODMR peak amplitudes for the first three orientations, neglecting the peak closest to the zero field splitting at 2.87 GHz. As the external magnetic field direction changes, ODMR peaks cross but their Rabi frequency is untouched as the MW drive is constant. To estimate the visibility of the ODMR peaks, which changes under the magnetic field amplitude, PL amplitudes measurements are made for each peak for two fixed MW times: at a time longer than the decoherence time (1 μs) and at a short time (60 ns). Then the loss of ODMR peak contrast can be corrected, so that this procedure substitutes the Rabi frequency measurement by an ODMR peak amplitude measurement. In that scheme, NV orientations fitting procedure is sped up fivefold compared to applying static fields, which requires 4 ODMR curves acquisition. Finally, we expect that this technique can be extended to quickly determine orientation of implanted defects in a lattice and single defects such as the divacancy defect in SiC, to probe superconductor magnetic vortices and magnons in ferromagnets.

In the preceding example, the following methods were used.

A CW 532 nm laser diode (CNI MGL-III-532) is used as the excitation (interrogation) source for the ODMR experiments. An acoustic optical modulator (Crystal Technology 3080-120, 1080AF-DIF0-1.0) used in a double-pass configuration then generates the laser pulses. A 60× microscope lens (N.A. 0.9) is used to excite and collect the luminescence. Light is then filtered through a spatial filter with a 20 μm pinhole and a bandpass filter (Semrock FF01-675/67-25) and detected with a photomultiplier tube (Hamamatsu H5783). Time between the initialisation and readout laser pulse is kept constant at 2 μs to maintain the same background counts. Boxcar detection using a 300 ns gate (SRS-250) is synchronized with the beginning of the readout pulse. Microwave pulses are delivered by a vectorial function generator (Agilent E8267D) and amplified to 30 dBm using an amplifier (Mini-Circuits ZHL-16 W-43+). The external magnetic field applied along NV axes was created by putting pairs of permanent magnets in opposite corners of a cubic support and rotating the cube around the diamond sample.

Magnetic field is calculated by combining the Zeeman splitting of the four peaks to obtain $(B_x,B_y,B_z)$[15]. Components are expressed in function of the NV peak set splittings $\Delta_i$ as defined in FIG. 4: $B_x=\sqrt{3}\gamma_e/2\pi(\Delta_2+\Delta_3)$, $B_y=\sqrt{3}\gamma_e/4\pi(\Delta_1+\Delta_2-\Delta_3-\Delta_4)$, $B_z=\sqrt{3}\gamma_e/4\pi(-\Delta_1+\Delta_2-\Delta_3+\Delta_4)$.

Figure 14:
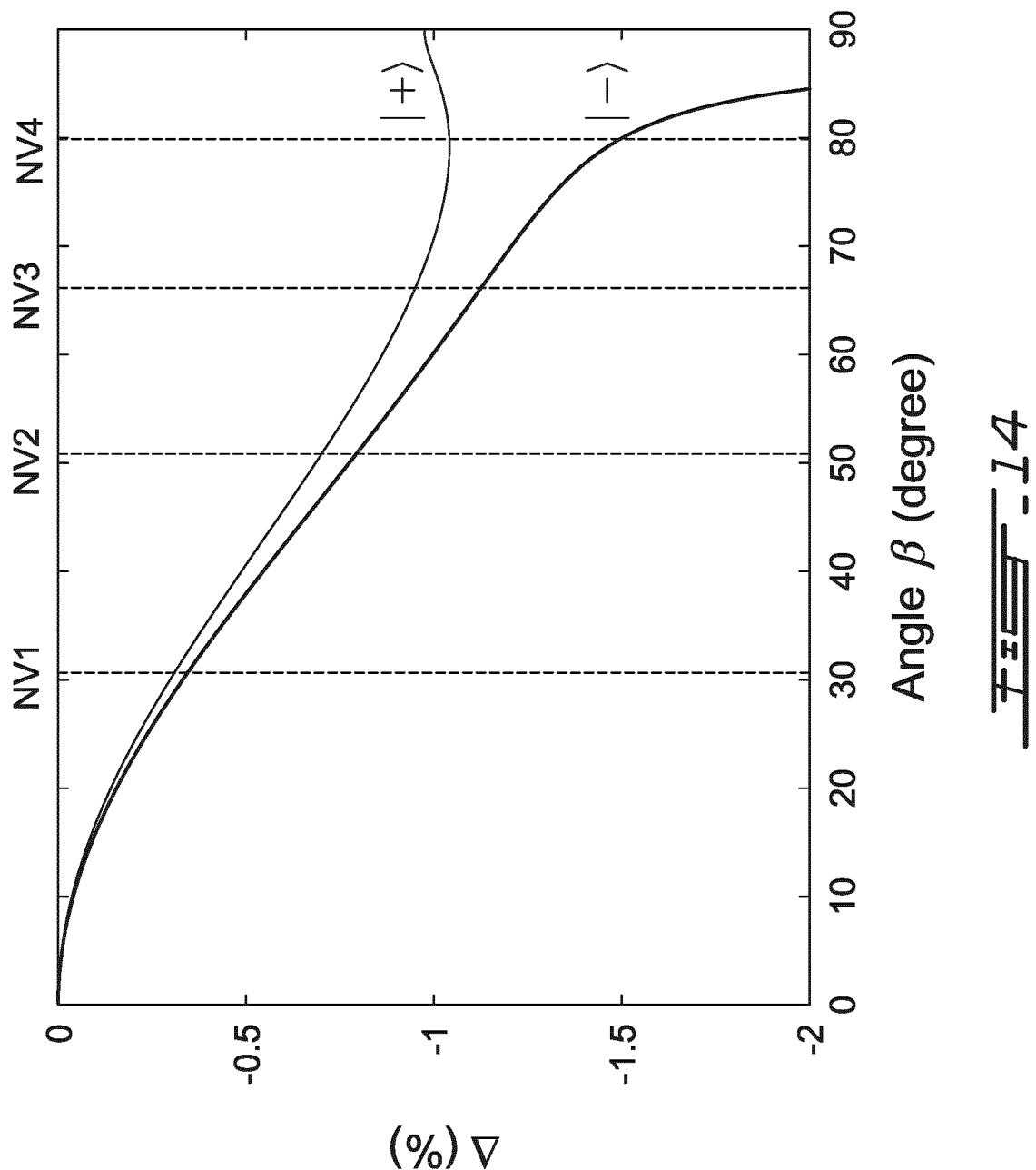
FIG. 14 shows the transition strength difference Δ between $w_x$; $w_y$ for eigenstates |+> and |−>, which confirms that the Rabi frequency average approximation holds for the experimental data.

FIG. 5 more specifically illustrates verification of orientation assignment by the Rabi technique with an external magnetic field. ODMR spectra for a static field of 1.25 mT applied along the various NV orientations. The red curve is the ODMR without additional external field. The highest frequency shifts (36 MHz, indicated by *) are obtained when the NV axes are aligned with the field, which allows the association of peaks (1 2 3 4) with orientations [11-1] [111] [1-1-1] [1-11]. Orientations obtained confirm the association given by the SSD technique based on Rabi frequencies. FIG. 14 shows the transition strength difference Δ between wx; wy for eigenstates |+> and |–>, which confirms that the Rabi frequency average approximation holds for the experimental data.

As can be understood, the examples described above and illustrated are intended to be exemplary only.

Alternate embodiments can be significantly different than the NV defect embodiment described above. For instance, other crystalline structures than diamond can have spin states sensitive to magnetic fields and which are also controllable and interrogatable using techniques such as described therein or other suitable techniques. In alternate embodiments, phonons may constitute a suitable alternative to photonic energy, be it for manipulating spin state or for generating spin affected transitions.

Concerning the type of crystalline structure and defects used in alternate embodiments, it will be noted specifically that other crystalline structures with similar or different geometries can have interrogatable spin states which are both sensitive to magnetic fields and alterable. Such alternate crystalline structures can have defects in 3 or more orientations, for instance. Examples of potential crystalline structures include SiC and ZnO crystalline structures, for instance. In some embodiments, the microwave emitter includes a waveguide which is provided in the form of a bidimensional cavity. However, in some other embodiments, the microwave emitter includes a waveguide which is provided in the form of a tridimensional cavity. As such, examples of potential waveguides include wire, 3D cavity, 2D coplanar guide, an optical fiber, a solid state optical waveguide, etc.

Concerning the technique used to identify the specific values of spin-state-altering energy, it will be noted that in the embodiment described above, the "dips" correspond to specific values of the spin-state-altering energy. Indeed, in the case of NV defects interrogated with green light and red light detection, the spin-state-altering energy values correspond to dips on the graph of red light intensity plotted against spin-state-altering energy values, but it will be understood that in alternate embodiments, such as other crystalline substrates interrogated in different ways, the spin-state-altering energy values can be identified in different ways. For instance, alternate techniques may lead to a detectable intensity peak rather than a detectable intensity dip.

In some embodiments, it has been demonstrated that spin state can be interrogated by measuring transmission intensity, see "Broadband magnetometry by infrared-absorption detection of nitrogen-vacancy ensembles in diamond" (Acosta, V. M. et al. Broadband magnetometry by infrared-absorption detection of nitrogen-vacancy ensembles in diamond. Appl. Phys. Lett. 97, 174104 (2010).). Indeed, while at the time of filing this specification, this technique's efficiency was affected by temperatures and the possibility of using an optical cavity, it may nonetheless be satisfactory for some applications and may evolve to be more broadly applicable in the future.

Moreover, in some embodiments, Rabi oscillations can be induced by providing optical photon stimulation in resonance with the optical transition. At room temperature, however, required very short laser pulses (picosecond range) which required technology which was expensive and volume-intensive at the time of filing this specification (see: Ultrafast optical control of orbital and spin dynamics in a solid-state defect). (Bassett, L. C. et al. Ultrafast optical control of orbital and spin dynamics in a solid-state defect. Science (80-). 1333, (2014).). Nonetheless, such alternate techniques can be suitable for some applications and may evolve to be more readily applicable in the future.

The interrogation subsystem and the spin-state-altering subsystem can be said to be controlled by controllers. The controllers can be any suitable form of circuit, programmable or hard-coded. For instance, it can be preferred to use independent microcontrollers to control the interrogation subsystem and the spin-state-altering subsystem in some applications. Most steps can be satisfactorily performed using a computer having a processor in the form of one or more integrated circuits and one or more software(s), or computer program products, stored in computer-readable memory made accessible to the processor. In this specification, the expression computer is not used limitatively, and is intended to encompass embodiments where the computer is provided in the form of one or more microcontrollers which effectively communicate data with one another and/or with one or more processors on chip, for instance. In such an embodiment, the combination of microcontrollers, off-chip electronics, on-chip electronics, memory(ies), can be said to constitute a computer in the sense in which the expression computer is used in this specification. Similarly, independent microcontrollers or suitable logic circuits or other electronics can be referred to as computers as well.

In some embodiments, the computer is configured and adapted to control the spin-altering subsystem to provide the spin-state-altering energy in a continuous manner. In some other embodiments, however, the computer can be configured and adapted to control the spin-altering subsystem to provide the spin-state-altering energy in a pulsed manner. Although the spin-state-altering energy is swept in some embodiments, the spin-state-altering energy can be fixed while controlling the interrogation subsystem to extract energy level data in some other embodiments.

More specifically, in some applications or embodiments, it can be preferred to separate components of a vectorial magnetometer into separate units. For instance, a first unit can be responsible to perform the ODMR experiment and identify energy levels of intensity dips, whereas another unit can be responsible to perform the pulse duration interrogation of the energy dips and to determine the Rabi frequencies. Still a third unit for instance, can receive data from the first unit and/or second unit, and perform defect orientation association, for instance. The different units can be proximate to one another in some embodiments, or remote from one another in some embodiments, and can communicate in a wired or wireless manner, or via a displaceable computer-readable memory, to name a few examples.

For instance, vectorial magnetometer can have a first computer which generates an output including Raby frequency data (and potentially other data elements), which can be stored or transmitted in a manner to be accessed by a separate, second computer which uses the output, as well as other required data elements, to determine a vector value of the magnetic field).

The determination of vectorial amplitude of the magnetic field can be used in a wide range of applications as diverse as the possibility to determine slight variations of the earth's magnetic field, applications in electronic component manufacturing, gyroscopes, study physical phenomena in solid state materials or even applications on satellites or space probes, to name a few examples.

Accordingly, the scope is indicated by the appended claims.

What is claimed is:

1. A vectorial magnetometer, comprising:
a sensory crystalline material substrate having defects sensitive to magnetic fields and oriented in at least three different orientations;
a spin-state-altering subsystem configured and adapted to emit spin-state-altering energy within the sensory crystalline material in pulses of varying durations in a manner to generate Rabi oscillations of the defects, the amplitude of the energy emitted within the sensory crystalline material being different for each one of the at least three orientations;

an interrogation subsystem configured and adapted to emit interrogation energy within the sensory crystalline material to generate a detectable intensity variation with the sensory crystalline material, the detectable intensity variation varying as a function of the spin-state of the defects, and a detector configured and adapted to measure the intensity of photons; and a computer configured and adapted to
using the detection of the Rabi frequencies, generate association data in which the spin-state-altering energy values are associated with corresponding ones of the at least three defect orientations;
using the association data, calculate the orientation of the magnetic field relative to the orientation of the sensory crystalline substrate; and
generate a signal indicative of the orientation of the magnetic field.

2. The vectorial magnetometer of claim 1 wherein the crystalline substrate is made of diamond and the defects are NV defects, wherein the spin-state-altering subsystem has a microwave emitter to emit the spin-state-altering energy.

3. The vectorial magnetometer of claim 2 the interrogation subsystem has a photonic emitter in the green portion of the optical spectrum to generate electron transitions of the NV defects from the base state to an excited state.

4. The vectorial magnetometer of claim 3 wherein the detector is adapted to detect an intensity of radiation in the red portion of the optical spectrum generated by the electrons returning to the base state from the excited state.

5. The vectorial magnetometer of claim 2 wherein the spin-state-altering subsystem includes a microwave emitter including a waveguide oriented in an orientation being substantially different than the orientations of the defects.

6. The vectorial magnetometer of the claim 5 wherein the waveguide is a metallic strip adjacent to a planar surface.

7. The vectorial magnetometer of claim 1 wherein the computer is further configured and adapted to control the spin-state-altering subsystem and the interrogation subsystem and to determine the Rabi frequency for each one of a plurality of spin-altering energy levels associated with corresponding ones of the defect orientations.

8. The vectorial magnetometer of claim 7 wherein the computer is further configured and adapted to control the spin-altering subsystem to provide the spin-state-altering energy in a continuous manner while sweeping the energy level and simultaneously control the interrogation subsystem to identify a plurality of spin-state-altering energy levels and produce spin-state-altering energy level data.

9. The vectorial magnetometer of claim 8 wherein the spin-state-altering energy level data includes two energy levels corresponding to each one of the defect orientations, further being configured to measure two Rabi frequencies for each one of all three orientations, associate the three Rabi frequency pairs to corresponding ones of the three orientations, determine, for each one of the three orientations, a scalar magnetic field amplitude based on the two corresponding Rabi frequencies, and determining a vectorial amplitude of the magnetic field based on the three scalar magnetic field amplitudes and defect orientation data.

10. The vectorial magnetometer of claim 7 wherein the step of determining each one of the Rabi frequencies includes:
i) providing a plurality of pluses of varying duration and of the corresponding spin-state-altering energy value to electrons of the defects at different relative amplitudes for different ones of the defect orientations, the different durations differently affecting the spin states of the defects via Rabi flopping,
ii) interrogating the spin-state of the defects by stimulating spin-affected transitions of the electrons, and measuring an intensity of energy varying as a function of said spin states, and
iii) determining the Rabi frequency based on a plurality of said measured energy intensity values corresponding to different ones of the pulse durations;
wherein the computer is further configured and adapted for storing the calculated Rabi frequencies of each of said spin-state-altering energy values into a memory in the form of Rabi frequency data.

11. The method of claim 10 wherein the computer is further configured and adapted to storing the relationship of intensity as a function of a plurality of pulse duration values, and determining the Rabi frequency.

12. The vectorial magnetometer of claim 10 wherein the computer is configured and adapted to:
access and process
a) defect orientation data indicative of the at least three different defect orientations in a reference frame of the crystalline substrate;
b) the Rabi frequency data including Rabi frequency values corresponding to each one of the spin-state-altering energy values;
c) spin-state-altering energy orientation data indicative of relative amplitude projections along corresponding ones of the at least three different defect orientations of spin-state-altering energy provided to the defects to obtain the Rabi frequency data; and
generating association data in which the spin-state-altering energy values are associated with corresponding ones of the at least three defect orientations based on the accessed and processed data.

13. The vectorial magnetometer of claim 12 wherein the computer is configured and adapted to calculate the vectorial magnitude of an external magnetic field to which the crystalline sensory material is exposed by using the association data, defect orientation data, and spin-state-altering energy level data.

14. The vectorial magnetometer of claim 13 wherein the computer is further configured and adapted to determine a scalar amplitude of the magnetic field in each one of said at least three different defect orientations based on the difference between the two energy levels of each one of the defect orientations.

15. The vectorial magnetometer of claim 13 wherein the controller is further configured and adapted to determine a vectorial amplitude of the magnetic field based on the determined scalar amplitudes and based on the defect orientation data.

* * * * *